United States Patent [19]

Milkovic

[11] 3,995,210
[45] Nov. 30, 1976

[54] VARIABLE GAIN ELECTRONIC CURRENT TRANSFORMER

[75] Inventor: Miran Milkovic, Scotia, N.Y.
[73] Assignee: General Electric Company, Schenectady, N.Y.
[22] Filed: June 11, 1975
[21] Appl. No.: 585,929

Related U.S. Application Data

[62] Division of Ser. No. 521,300, Nov. 6, 1974, Pat. No. 3,921,069.

[52] U.S. Cl. .............................................. 323/94 H
[51] Int. Cl.² ........................................ G01R 21/08
[58] Field of Search ................ 323/4, 16, 19, 94 H; 324/45, 103 R, 107, 117 H, 142

[56] References Cited
UNITED STATES PATENTS

| | | | |
|---|---|---|---|
| 3,172,032 | 3/1965 | Hunt | 323/94 H |
| 3,885,212 | 5/1975 | Herbert | 324/45 H |

*Primary Examiner*—A. D. Pellinen
*Attorney, Agent, or Firm*—Vale P. Myles

[57] ABSTRACT

A variable gain electronic current transformer for detecting the current flow into a power consuming system. An operational amplifier amplifies the detected current and the output of the operational amplifier is converted into a magnetic flux field which is directed onto one surface of a Hall effect element. A variable current source supplies current to a second orthogonal surface of the Hall effect element to thereby generate an output voltage which is directly proportional to the product of the output of the operational amplifier and the variable current source. This output voltage from the Hall effect element is coupled back to the input of the operational amplifier. A second Hall effect element is positioned in the flux field generated at the output of the operational amplifier and in addition has a second variable current source coupled to one surface thereof so that the output of the second Hall effect element is a voltage which is proportional to the product of the output of the operational amplifier and the second variable current source. Accordingly, the output voltage of the second Hall effect element is directly proportional to the product of the detected current and the output of the second current source and is inversely proportional to the output of the first variable current source to thereby provide a current transformer having a large dynamic range depending upon the variance of the outputs of the first and second variable current sources.

3 Claims, 3 Drawing Figures

VARIABLE GAIN ELECTRONIC CURRENT TRANSFORMER

This is a division of application Ser. No. 521,300, filed Nov. 6, 1974, now U.S. Pat. No. 3,921,069, issued Nov. 18, 1975.

BACKGROUND OF THE INVENTION

This invention relates to current transformers and in particular, it relates to variable gain electronic current transformers.

In the measurement of electrical energy, such as that flowing into homes and industrial developments, numerous efforts have been made to provide reliable and efficient, yet economical means for measuring and recording the electrical energy consumed. Examples of recent developments in the electrical energy measuring technology are disclosed in the patent applications of Miran Milkovic, Ser. No. 361,030, filed May 17, 1973, now U.S. Pat. No. 3,875,509, issued Apr. 1, 1975, and Ser. No. 395,142, filed Sept. 7, 1973, now U.S. Pat. No. 3,875,508, issued Apr. 1, 1975, wherein solid state electronic meters are disclosed for measuring the flow of energy in a power system. These applications disclose a method and apparatus for detecting the current flow through at least one line and the voltage of a line which parameters are appropriately multiplied and converted to a pulse train signal which is counted in a display mechanism to provide an indication of the electrical energy being consumed. These solid state electrical energy meters, however, have a critical drawback in that the dynamic range thereof is somewhat limited and the signal-to-offset or the signal-to-noise ratio must be improved in order to provide a more accurate meter for measuring a wide range of power flow past a given point. Accurate sensing of AC currents by using conventional current transformers has not been simple because of the relatively large current dynamic range experienced in both industrial and residential power systems. Thus, present-day current transformers capable of transforming AC currents over a rather large dynamic range are both expensive and large and accordingly, have proven to be quite uneconomical. It therefore has become desirable to provide a simple, economical variable current transformer which can be packaged in a relatively small container for transforming AC currents over a substantial dynamic range.

It therefore is an object of the present invention to provide a variable gain electronic current transformer for transforming AC currents over a large dynamic range.

SHORT STATEMENT OF THE INVENTION

Accordingly, the present invention relates to a variable gain electronic current transformer comprising means for detecting the current flow through a circuit. The detected current is amplified by an operational amplifier and converted to a flux field which is directed onto one surface of a Hall effect device. A first variable gain current source conducts current through a second orthogonal surface of the Hall effect device so that the Hall effect device provides an output voltage which is proportional to the product of the variable current source output and the flux field generated at the output of the operational amplifier. This voltage is coupled back in a negative feedback path to the input of the operational amplifier. Also positioned in the flux field at the output of the operational amplifier is a second output Hall effect device which is isolated from the current detecting means and the first Hall effect device. A second variable current source provides a current which is conducted through a surface of the Hall effect device which is orthogonal to the surface through which the magnetic flux is directed. This Hall effect device generates an output voltage which is directly proportional to the detected current and, in addition, can be made variable by varying either the first or second variable current sources. Thus, a wide dynamic range can be achieved by appropriately varying either one or both of the variable current sources coupled to the respective Hall effect devices.

BRIEF DESCRIPTION OF THE DRAWINGS

Other objects, features and advantages of the present invention will become more fully apparent from the following detailed description of the preferred embodiment, the appended claims and the accompanying drawings, in which:

DETAILED DESCRIPTION OF THE PREFERRED EMBODIMENT

Figure 1:
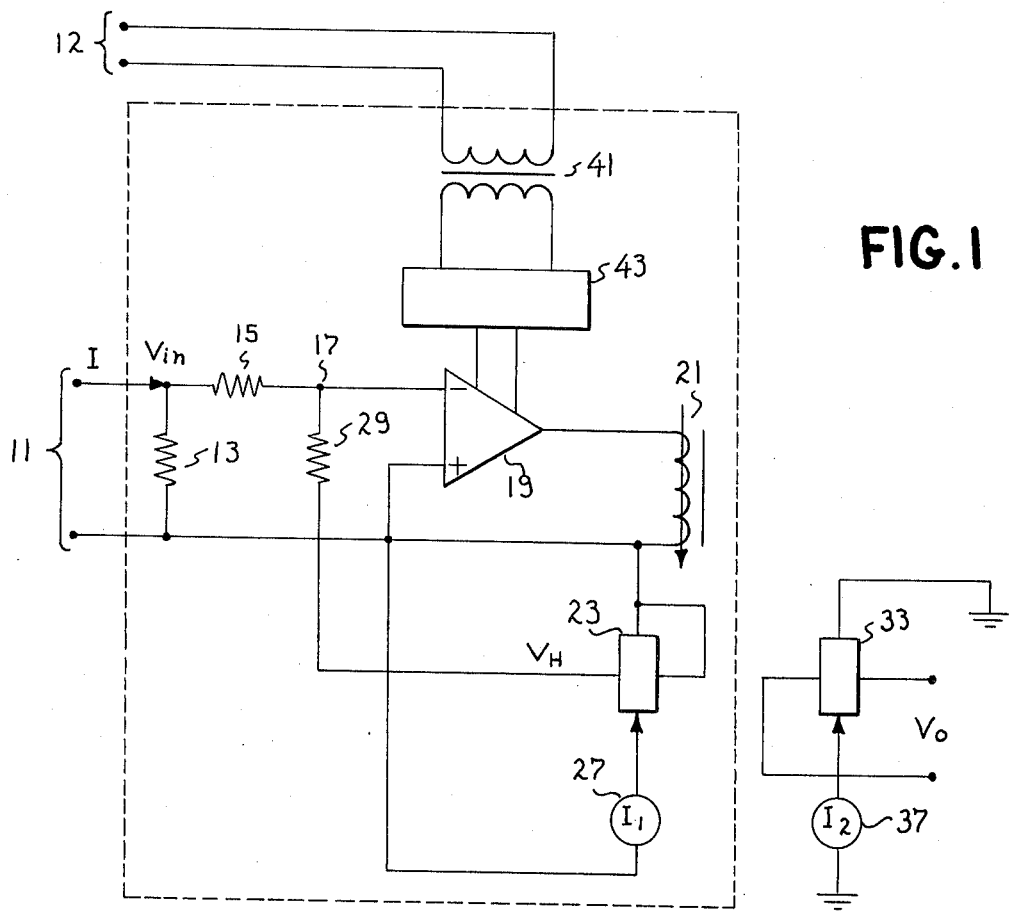
FIG. 1 is a schematic illustration of the variable gain electronic current transformer of the present invention.

Refer now to FIG. 1 where there is disclosed the preferred embodiment of the variable gain electronic current transformer of the present invention. Referring to the drawing, input terminals 11 are connected in series with a power utilizing circuit such as the input circuits to a manufacturing facility or a residential home. The current flow in the power utilizing system is sensed by resistor 13 which provides a voltage $V_{in}$ across the resistor 13. This voltage generates a current flow $V_{in}/R_{15}$ into the summing point 17 of an operational amplifier 19 of conventional design. As is well known in the art, the voltage at summing point 17 is approximately zero if the amplification factor of the operational amplifier 19 is large and accordingly, the point 17 is at virtual ground. The amplifier 19 has an output which is connected to a suitable flux generating means, such as a coil 21, wound about a ferromagnetic bar having a relatively low reluctance path to the generated flux. The opposite end of the coil 21 is connected back to the noninverting input terminal of the operational amplifier 19. A first Hall effect device 23 is positioned such that one surface thereof is aligned substantially perpendicular with the direction of the flux field generated by the coil 21. Hall effect devices are well known in the art as exemplified by the teachings of U.S. Pat. Nos. 3,317,835; 3,328,689 and 3,343,084. Accordingly, the specific structure and physical operation of Hall effect devices will not be described herein in detail.

Figure 2:
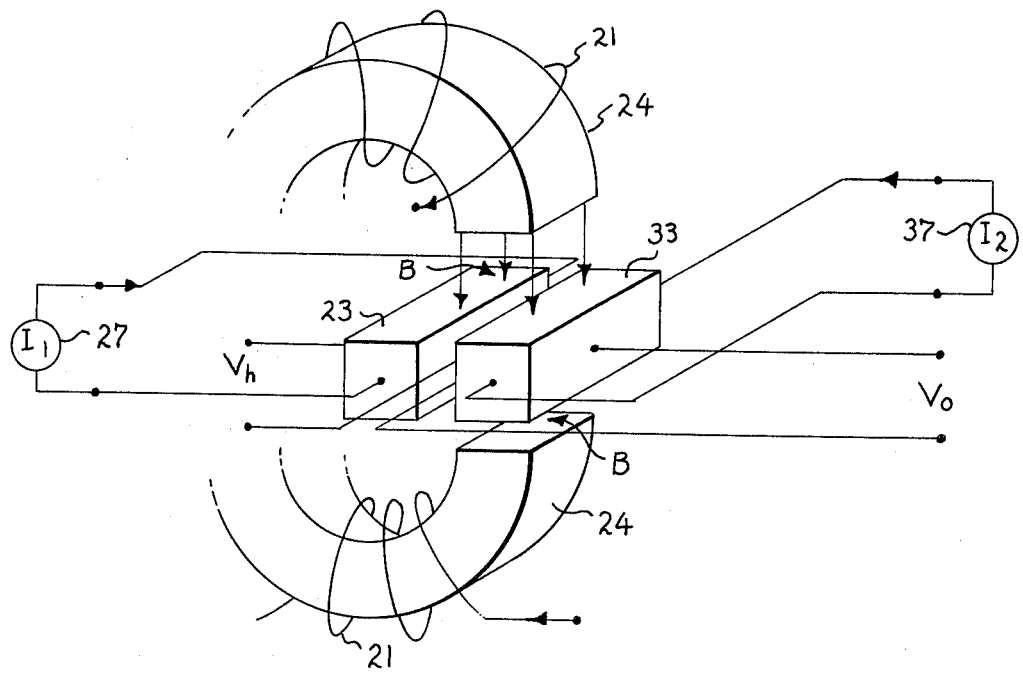
FIG. 2 is a simplified perspective view of a pair of Hall effect devices having a means for generating a magnetic flux field to pass therethrough.

Referring to FIG. 2, a pair of Hall effect elements 23 and 33 are shown positioned between the respective ends of a ferromagnetic flux path 24. A coil 21 is wound about the ferromagnetic flux path 24 such that a flux field is directed substantially perpendicular into the upper surface and out of the lower surface of each of the Hall effect elements 23 and 33. At the same time a current $I_1$ is directed through the Hall effect element 23 substantially perpendicular to the direction in which the magnetic flux field B passes therethrough. As is well known in the art, when a magnetic flux field is directed onto one surface of a Hall effect device and current is passed through a surface which is perpendicular to the surface through which the flux field passes, a voltage is generated across a third pair of parallel surfaces orthogonal to the other surfaces which voltage is proportional to the product of the flux field and the current passing through the Hall effect element. This relationship may be expressed by the following relationship:

$$V = kIB \qquad (1)$$

wherein $B$ is the flux density passing through the Hall effect element, $I$ is the current passed through the Hall effect element in a direction orthogonal to the flux field and $V$ is the output voltage generated by the passage of the flux field and the current through the Hall effect element.

Refer now back to FIG. 1 where there is disclosed a variable current generator 27 for generating a variable current $I_1$ which is directed through the Hall effect element 23 in a direction substantially perpendicular to the direction through which the magnetic field passes through the Hall effect element. An output voltage $V_H$ is thereby generated which is proportional to the product of the magnitude of the current $I_1$ which is generated by the variable current source 27 and the flux density B generated by the coil 21. Since, however, the flux density generated by the coil 21 is proportional to the current flowing therethrough, it can be seen that the voltage $V_H$ is proportional to the product of the current flowing through the coil 21 from the output of the operational amplifier 19 and the current $I_1$ generated by the variable current source 27. This voltage is coupled back to the summing point 17 through resistor 29. Since the voltage at the summing point 17 is at approximately zero volts and since the input impedance to the operational amplifier is substantially infinite, the following relationship expresses the summation of current at the summing point 17.

$$\frac{V_{in}}{R_{15}} - \frac{V_H}{R_{29}} = 0 \qquad (2)$$

This relationship can be appropriately transposed as follows:

$$V_H = V_{in} \frac{R_{29}}{R_{15}} = G_1(B)I_1 \qquad (3)$$

wherein $G_1(B)$ is the variable gain of the Hall effect element 23. By solving equation 3 for $G_1(B)$, the following relationship is derived:

$$G_1(B) = (V_{in} R_{29}/R_{15})\, 1/I_1 = (IR_{13} R_{29}/R_{15}) \times 1/I_1 \qquad (4)$$

wherein $I$ is the detected current flowing in the power consuming system. It therefore can be seen that the gain of the Hall effect element 23 is directly proportional to the sensed input current passing through resistor 13 and inversely proportional to the magnitude of the variable current $I_1$ generated by the variable current source 27.

A second Hall effect element 33 is also positioned in the flux path generated by the coil 21. These Hall effect elements 23 and 33 are isolated from each other by an oxide insulation in the preferred embodiment or they may be separated mechanically in order to obtain better isolation between the input and output. By utilizing known integrated circuit techniques, however, both of these Hall effect elements can be positioned proximate to, yet isolated electrically from, one another so that very little space is required by these elements. Preferably the intrinsic characteristics of the Hall effect elements 23 and 33 should be identical in order to provide for easy calibration of the current transformer.

As illustrated, a second variable current source 37 is provided for generating a variable current $I_2$ which is directed through the Hall effect element 33 in a direction perpendicular to the direction in which the flux field from the coil 21 passes through the element. Thus, a voltage $V_o$ is generated at the output of the Hall effect element 33 which is directly proportional to the product of the current $I_2$ and the flux field generated by the coil 21. This output voltage may be expressed as follows:

$$V_o = G_2(B)I_2 \qquad (5)$$

wherein $G_2(B)$ is the gain of the Hall effect element due to the flux field $B$ passing therethrough.

Since the Hall effect elements are adjacent to one another on the same semiconductor chip, preferably spaced at a distance of about 10 mils from one another, it is evident that the two devices can be made almost identical. Thus, the gain factor of each element can be considered substantially equal. Accordingly, $$G_1(B) = G_2(B) \qquad (6)$$

From equations 4, 5 and 6 it can be seen that the output voltage $V_o$ can be given as follows:

$$V_o = \left( \frac{R_{29}I_2}{R_{15}I_1R_{13}} \right) I = GI \qquad (7)$$

wherein G is the system gain of the current transformer and $I$ is the detected current in the power consuming system. Thus, it can be seen that the voltage $V_o$ is directly proportional to the sensed input current $I$ passing through resistor 13 and that the gain G is directly proportional to the magnitude of the current $I_2$ and inversely proportional to the current $I_1$. This relationship for the gain of the current transformer is given as follows:

$$G = \frac{R_{29}I_2}{R_{15}I_1} R_{13} \qquad (8)$$

It therefore can be seen that the gain of the current transforming system can be easily controlled by varying either $I_2$, $I_1$ or for that matter $R_{15}$ and $R_{29}$. However, in order to provide for convenient linear gain control, the variance of $I_2$ is the most convenient in providing for a wide dynamic range.

From the foregoing, it can be seen that the output voltage $V_o$ is not dependent upon any non-linearities which might exist in the system and in addition, since the operational amplifier, the Hall effect elements and the resistances $R_{15}$ and $R_{29}$ can be put on the same monolithic silicon chip by proper design and processing, environmental effects such as changes of temperature and humidity can be virtually negated. Therefore, it can be seen that a highly accurate, efficient and economical variable gain electronic current transformer can be provided by the present invention.

In the field where battery driven power supplies are not readily available, the power for driving the operational amplifier 19 can be derived from input terminals 12 which are connected across the lines being coupled to the manufacturing installation or the residential power utilizing system. This voltage is transformed down by transformer 41 and appropriately rectified and regulated by means of a conventional rectifier circuit 43. Thus the current transformer of the present invention can be entirely self-contained whenever it is utilized in the field.

Thus, in summary, a variable gain electronic current transformer is provided which utilizes two silicon Hall elements as variable gain devices on the same silicon chip in a feedback configuration such that the non-linearity, temperature and offset effects, normally experienced, are virtually compensated due to the large open-loop gain of the operational amplifier in the feedback loop and by the adjacent Hall effect elements having almost identical characteristics. It further can be seen that the output voltage $V_o$ is directly related to the current sensed by the resistor 13. Further the output voltage $V_o$ can be easily varied by an external control DC signal such as $I_1$ or $I_2$. In practice it has been found that the accuracy of the transforming ratio and the phase angle has been better than 0.1% and that the dynamic range of the current transformer can be as high as 200:1.

While it should be understood that the present invention can be used in various applications wherein current transformers are required, one preferred application of the invention is in connection with a watt-hour converter such as disclosed and described in U.S. Pat. No. 3,875,509 and which is hereby incorporated by reference and which is assigned to the common assignee herewith. Such a watt-hour meter is illustrated schematically in FIG. 3. In the simplified diagram of FIG. 3, the three power lines 301, 302 and 303 of a three phase, 60 Hz electrical system conduct instantaneous line currents $i_1$, $i_2$ and $i_3$ to a delta-connected polyphase electrical load. Across the three branches of the electrical load, three instantaneous line-to-line voltages $v_{12}$, $v_{32}$ and $v_{31}$ are impressed. Two instrument potential transformers $PT_{12}$ and $PT_{32}$ are electrically connected with the transmission lines 301, 302 and 303 as illustrated in the figures. In addition, two variable gain electronic current transformers, $CT_1$ and $CT_3$ are shown coupled with the transmission line 301 and 303, respectively. As illustrated the output side of the potential transformers $PT_{12}$ and $PT_{32}$ are also coupled to the electronic current transformers $CT_1$ and $CT_3$ to provide a power supply for driving the operational amplifier 19 illustrated in FIG. 1.

Figure 3:
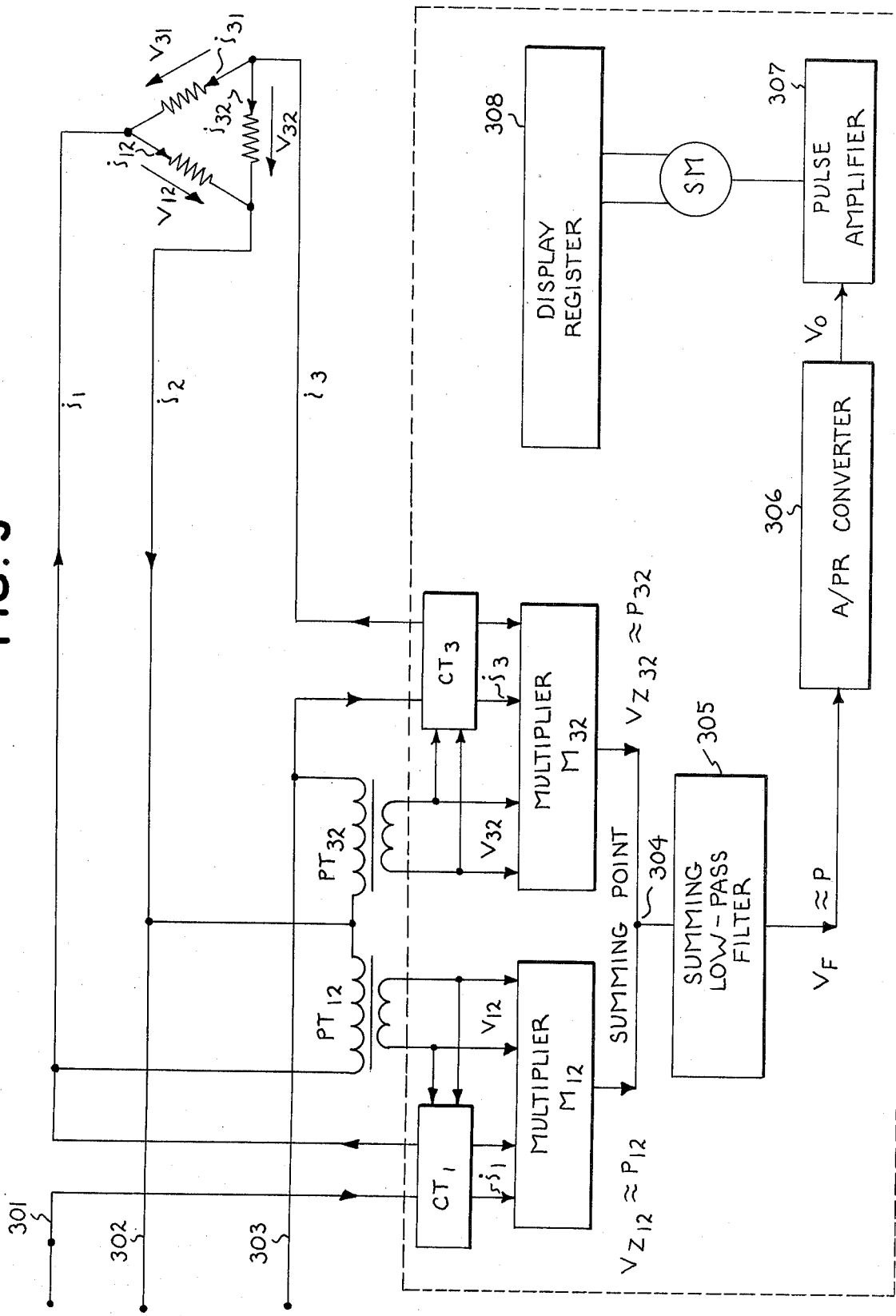
FIG. 3 is a schematic illustration of an electronic energy meter utilizing the variable gain electronic current transformer of the present invention.

The aforesaid instrument transformers are coupled with the transmission lines according to the teachings of the well-known Blondel theorem. Thus, line 302 has been arbitrarily selected as the common point, or line, for carrying out power and energy metering in accordance with the aforesaid theorem. The electronic current transformer $CT_1$ provides an output analog signal representative of the instantaneous line current $i_1$. The electronic current transformer $CT_3$ provides an output analog signal representative of the instantaneous line current $i_3$. The potential transformer $PT_{12}$ provides an output analog signal representative of the instantaneous line voltage $v_{12}$. The potential transformer $PT_{32}$ provides an output analog signal representative of the instantaneous line voltage $v_{32}$. The analog signals representing $i_1$ and $v_{12}$ are delivered to the input of a multiplier $M_{12}$. Similarly, the analog signals representing $i_3$ and $v_{32}$ are delivered to the input of another multiplier $M_{32}$. The multiplier $M_{12}$, in effect, multiplies the signals representing $i_1$ and $v_{12}$ and produces at the output of said multiplier a signal $v_{z12}$ which is proportional to the product $P_{12} = i_1 v_{12}$. The multiplier $M_{32}$, in effect, multiplies the signals representing $i_3$ and $v_{32}$ and produces at the output of said multiplier another signal $v_{z32}$ which is proportional to the product $P_{32} = i_3 v_{32}$. As indicated at FIG. 3, the output signals $v_{z12}$ and $v_{z32}$, which represent instantaneous partial powers $p_{12}$ and $p_{32}$, respectively, are summed at a summing point 304 to provide another signal representing the total instantaneous system power $p$, where $$p = i_1 v_{12} + i_3 v_{32} \tag{9}$$

The metering principle employed in the illustrative example is based on the use of the Blondel theorem which enables power measurement in, for example, a three-phase electrical system, but uses only two multiplying channels. According to the theorem the power in a system of N lines may be measured by (N−1) wattmeter elements so arranged that each of the (N−1) lines contains one current measuring element with a corresponding potential measuring element being connected between each of the lines and a common point. In the event that the common point happens to be one of the lines (e.g., line 302 in FIG. 3) power can be measured by (N−1) elements. Thus, in the three-wire system of FIG. 3, the total instantaneous power $p$ delivered to the load is:

$$p = i_1 v_{12} + i_3 v_{32} = p_{12} + p_{32} \tag{10}$$

where $v_{12}$ and $v_{32}$ are instantaneous line voltages and $i_1$ and $i_2$ are instantaneous line currents. Also $p_{12}$ and $p_{32}$ are instantaneous partial powers.

In FIG. 3 the signals $v_{z12}$ and $v_{z32}$, representing the aforesaid partial powers $p_{12}$ and $p_{32}$, are combined at the summing point 304 and delivered to an input of a summing low-pass filter 305. The filter 305 sums, or integrates, and averages the aforesaid signals representing the partial powers $p_{12}$ and $p_{32}$ to produce at the output of said filter a signal $V_F$ proportional to the active average total system power P. In effect, the filter 305 performs integrating and averaging operations in accordance with the following relationship.

$$P = \frac{1}{T} \int_o^T i_1 v_{12} dt + \frac{1}{T} \int_o^T i_3 v_{32} dt \tag{11}$$

or $$P = \frac{1}{T} \int_o^T p_{12} dt + \frac{1}{T} \int_o^T p_{32} dt$$

wherein $$P_{12} = \frac{1}{T} \int_o^T p_{12} dt, \text{ and}$$

$$P_{32} = \frac{1}{T} \int_o^T p_{32} dt$$

Therefore, $$P = P_{12} + P_{32} \qquad (12)$$

where $P_{12}$ and $P_{32}$ are average partial powers and $P$ is average total power.

It can also be shown that the active, average polyphase power $P$ is:

$$P = \sqrt{3}\, V I \cos\theta \qquad (13)$$

where $V$ represents rms line voltage and $I$ represents rms line current; $P$ represents the true active average power in a polyphase load; and $\theta$ is the phase angle.

The output signal $V_F$ at the output of the filter 305 is delivered, as indicated at FIG. 3, to the input of the analog to pulse-rate converter 306 of the present invention which functions to convert the signal $V_F$ (which is proportional to $P$) to system energy W according to the relationship:

$$W = \int_0^T p\, dt \qquad (14)$$

However, if the time duration $T = T_F$ (i.e., the indicated integration occurring in the A/PR converter 306 for a finite time duration $T_F$) then each time the energy W accumulates to a quantity W in the converter according to the relationship $$W = \int_0^{T_F} p\, dt \qquad (15)$$

an output signal pulse $V_o$, representing a predetermined quantity of electrical energy $W$, is delivered at the output of the A/PR converter 306. For example, in the specific embodiment illustrated each output signal pulse $V_o$ is representative of the quantized electrical energy $W = 1.2$ Watt-hours (Wh). Thus, the A/PR converter 306 delivers a series, or train, of pulses $V_o$ at its output; the accumulated number of output pulses $V_o$ representing the total electrical energy $W$ of the system. As aforementioned, the series of pulses $V_o$ has a variable pulse repetition rate $f$ which is proportional to the total average system power $P$.

As indicated at FIG. 3, the output pulses $V_o$ are delivered to the input of a pulse amplifier 307, the amplified output of which drives a stepping motor SM. The stepping motor SM, in turn, operates an electromechanical kW-hour display register 308 which displays, in decimal digits, the accumulated energy in kilowatt-hours (kW-hours). While a conventional stepping motor SM and electromechanical register 308 are illustrated at FIG. 3, it is to be understood that the stepping motor SM and register 308 are indicated by way of example only. The electrical energy meter according to the present invention may employ, instead of the aforesaid stepping motor and electromechanical register, a liquid crystal or LED display suitably coupled with a nonvolatile electronic memory element and driven by logic circuitry. The Watt-hour meter of FIG. 3 requires an analog to pulse rate converter which has a wide dynamic range and in addition has long term stability and an exceedingly low conversion error. Such an analog to pulse rate converter, as disclosed in the present application, not only provides the aforementioned features but also is compact because of the monolithic circuitry utilized and requires very little power drain because of the utilization of C-MOS circuitry.

As the gain of the electronic current transformers $CT_1$ and $CT_3$ is raised, for example, because of a decreasing flow of current in lines 301 and 303, the amplification factor of the multipliers $M_{12}$ and $M_{32}$ or the amplification factor of the analog to pulse rate converter 306 can be correspondingly decreased so that the system has the same throughput gain factor. This can be accomplished in a simple manner using known techniques. For example, the current source 37, which in each of the current transformers $CT_1$ and $CT_3$ generates the current $I_2$, could be made to vary inversely with the voltage output of the respective multipliers $M_{12}$ and $M_{32}$. At the same time a variable attenuator at the output of the low pass filter 305 (not shown) could be varied so that as the gain of one or both of the current transformers increases, the attenuation of the signal $V_F$ correspondingly increases to thereby provide a uniform and constant system gain factor.

While the present invention has been disclosed in connection with a preferred embodiment, it should be understood that there may be other obvious modifications of the invention which fall within the spirit and scope of the invention as defined by the appended claims.

What is claimed is:

1. A variable gain electronic current transformer comprising in combination:
    means for sensing the current flow through a circuit,
    operational amplifier means for amplifying said sensed current,
    a first source of variable current,
    means responsive to the output of said variable current source and said amplifier for generating a feed-back voltage having a magnitude which is proportional to the product of the output of said variable current source and the output of said amplifier, said feed-back voltage being coupled to the summing point input of said operational amplifier,
    a second source of variable current,
    means responsive to the output of said operational amplifier and said second current source for generating an output voltage, said output voltage being proportional to said sensed current and being directly variable in accordance with the output of said second current source and inversely variable in accordance with said first current source.

2. The variable gain electronic current transformer of claim 1 wherein said means responsive to the output of said first variable current source and said amplifier for generating a feedback voltage comprises a Hall effect device, and means for converting the output of said operational amplifier into a flux field having a magnitude proportional to the output of said operational amplifier, said flux field being directed through one plane of said Hall effect device and said output of said variable current source being directed through a second orthogonal plane of said Hall effect device, the output voltage of said Hall effect device being coupled back to the summing point input of said operational amplifier.

3. The variable gain electronic current transformer of claim 2 wherein said means responsive to the output of said operational amplifier and said second current source comprises a second Hall effect element, the magnetic field generated by the output of said operational amplifier being directed through one plane of said second Hall effect element and the output of said second variable current source being directed through a second orthogonal plane of said Hall effect element wherein the output of said second Hall effect element is directly proportional to said sensed current and is directly variable in accordance with the output of said second current source and inversely variable in accordance with said first current source.

* * * * *